United States Patent
Huang

(10) Patent No.: US 7,570,093 B1
(45) Date of Patent: Aug. 4, 2009

(54) DELAY-LOCKED LOOP AND A DELAY-LOCKED LOOP DETECTOR

(75) Inventor: Chih-Haur Huang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/076,319

(22) Filed: Mar. 17, 2008

(51) Int. Cl.
*H03L 7/06* (2006.01)

(52) U.S. Cl. .................................... 327/158; 327/149

(58) Field of Classification Search ............... None
See application file for complete search history.

(56) References Cited

U.S. PATENT DOCUMENTS

| | | | | |
|---|---|---|---|---|
| 6,678,206 B2* | 1/2004 | Chu et al. | | 365/189.08 |
| 6,844,761 B2* | 1/2005 | Byun et al. | | 327/149 |
| 6,867,627 B1* | 3/2005 | Murtagh | | 327/158 |
| 6,987,407 B2* | 1/2006 | Chung et al. | | 327/158 |
| 7,027,548 B1* | 4/2006 | Palusa et al. | | 375/375 |
| 7,199,630 B2* | 4/2007 | Kim | | 327/158 |
| 7,202,719 B2* | 4/2007 | Gabato et al. | | 327/158 |
| 2004/0251936 A1* | 12/2004 | Gomm | | 327/141 |
| 2008/0284475 A1* | 11/2008 | Lee | | 327/149 |

* cited by examiner

*Primary Examiner*—Tuan Lam
*Assistant Examiner*—Hiep Nguyen
(74) *Attorney, Agent, or Firm*—Rabin & Berdo, P.C.

(57) ABSTRACT

A delay-locked loop detector detects a control voltage of a delay-locked loop, in which the delay-locked loop generates an output clock signal according to a delay time that is controlled by the control voltage. The delay-locked loop detector includes a voltage detector, a switch, and a counter. The voltage detector detects the control voltage. The switch passes the control voltage to the voltage detector. The counter counts a constant period of time, in which the counter enables the switch to pass the control voltage to the voltage detector after the constant period of time.

13 Claims, 5 Drawing Sheets

DELAY-LOCKED LOOP AND A DELAY-LOCKED LOOP DETECTOR

BACKGROUND

1. Field of Invention

The present invention relates to a delay-locked loop. More particularly, the present invention relates to a delay locked loop detector.

2. Description of Related Art

Recently, with the outstanding improvement of the semiconductor process, the operating frequency of VLSI circuits has increased significantly. High-speed systems such as wireless phones, optical fiber links, microcomputers, and high-end system-on-a-chip (SOCs) have transmission rates at the Giga-Hertz level. Therefore, electronic devices need to upgrade their operating frequency in order to keep up with the improved semiconductor process. Furthermore, since a lot of circuits are integrated on a chip, the clock signal is entirely distributed on the chip, and clock skew problems arise as a result.

For example, when an input clock drives a chip, an uncertain delay appears between the input clock and the internal clock, which makes the chip work incorrectly. In order to synchronize the various clock signals and suppress the clock skew on the chip, the phase-locked loop (PLLs) and delay-locked loop (DLLs) have been applied in many high-speed circuits and systems.

FIG. 1 shows a block diagram of the conventional DLL. The DLL includes a voltage-controlled delay line 107 (VCDL), a phase detector 101 (PD), a loop filter 105 (LF), and a charge pump 103 (CP). The PD 101 detects the phase difference between the internal clock and the input clock. The LF 105 is usually implemented with a single capacitor, which is charged/discharged by the CP 103, to reduce high-frequency noise and provide a constant dc level to the VCDL 107.

The PD 101 output signals UP and DN are integrated into the CP 103 and LF 105 to generate a control voltage (VCTL) for the delay line 107. When the circuit is locked, VCTL is a constant and the VCDL 107 finds the optimum path so that the input clock and the internal clock can be synchronized.

However, in this conventional DLL, the irregular high supply voltage or a clock signal with many jitters might cause the VCTL to exceed the proper voltage range, and the VCTL is unable to return back to the normal voltage range, which makes the DLL deadlock at the wrong frequency, that is, the DLL cannot generate a clock signal with an expected frequency, and the whole circuit on the chip might operate at the wrong frequency as a result.

Therefore, there is a need for a new delay-locked loop and a detection circuit thereof which can tell if the DLL is deadlock at wrong frequency and rectify the situation accordingly.

SUMMARY

According to one embodiment of the present invention, the delay-locked loop detector detects a control voltage of a delay-locked loop, in which the delay-locked loop generates an output clock signal according to a delay time that is controlled by the control voltage.

The delay-locked loop detector includes a voltage detector, a switch, and a counter. The switch passes the control voltage to the voltage detector so the voltage detector can detect the control voltage. The counter counts a constant period of time. After the period of time, the counter enables the switch to pass the control voltage to the voltage detector.

The voltage detector includes a first voltage level detector and a second voltage level detector. The first voltage level detector resets the delay-locked loop for re-locking when the control voltage is greater than a first voltage level, while the second voltage level detector resets the delay-locked loop for re-locking when the control voltage is less than a second voltage level.

According to another embodiment of the present invention, the delay-locked loop includes a delay circuit, a voltage detector, a switch, and a counter. The delay circuit generates an output clock signal according to a delay time which is controlled by a control voltage. The switch passes the control voltage to the voltage detector, and the voltage detector detects the control voltage. The counter counts a constant period of time, in which the counter enables the switch to pass the control voltage to the voltage detector after the constant period of time.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
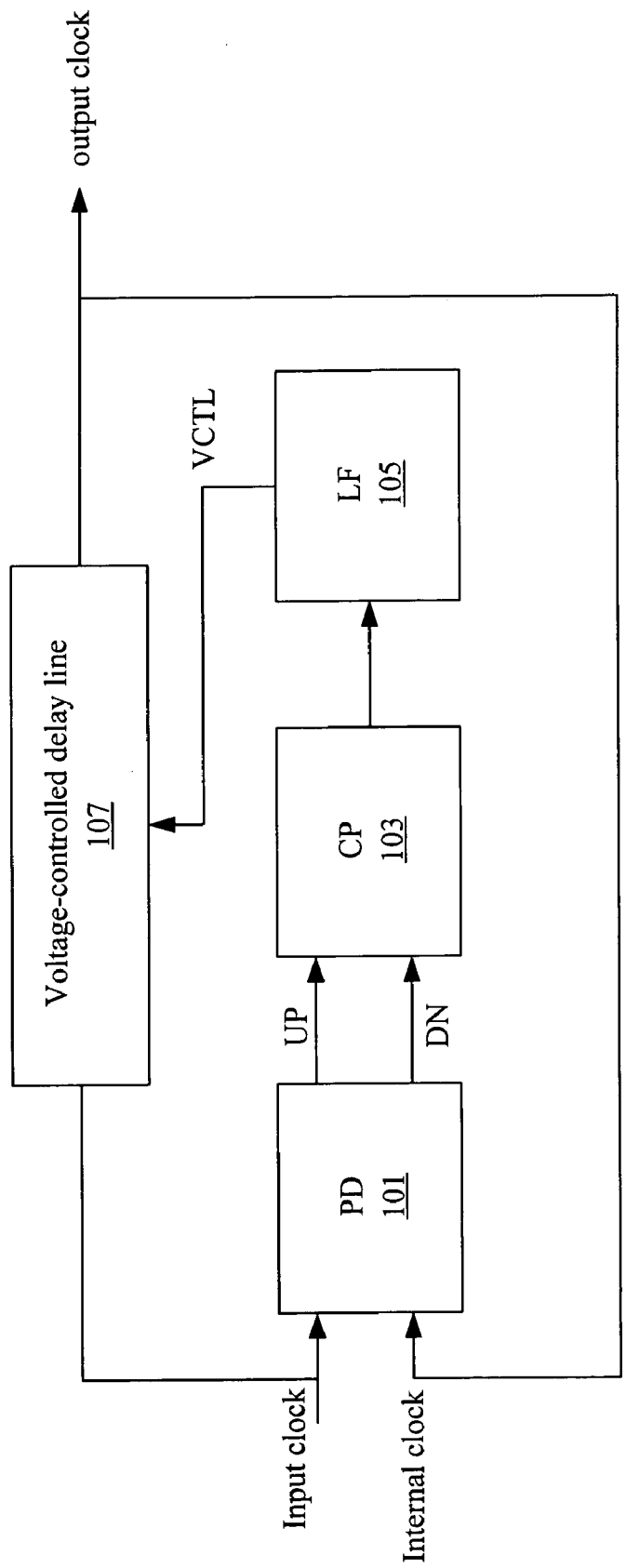
FIG. 1 shows the block diagram of the conventional DLL.

Reference will now be made in detail to the present preferred embodiments of the invention, examples of which are illustrated in the accompanying drawings. Wherever possible, the same reference numbers are used in the drawings and the description to refer to the same or like parts.

Figure 2:
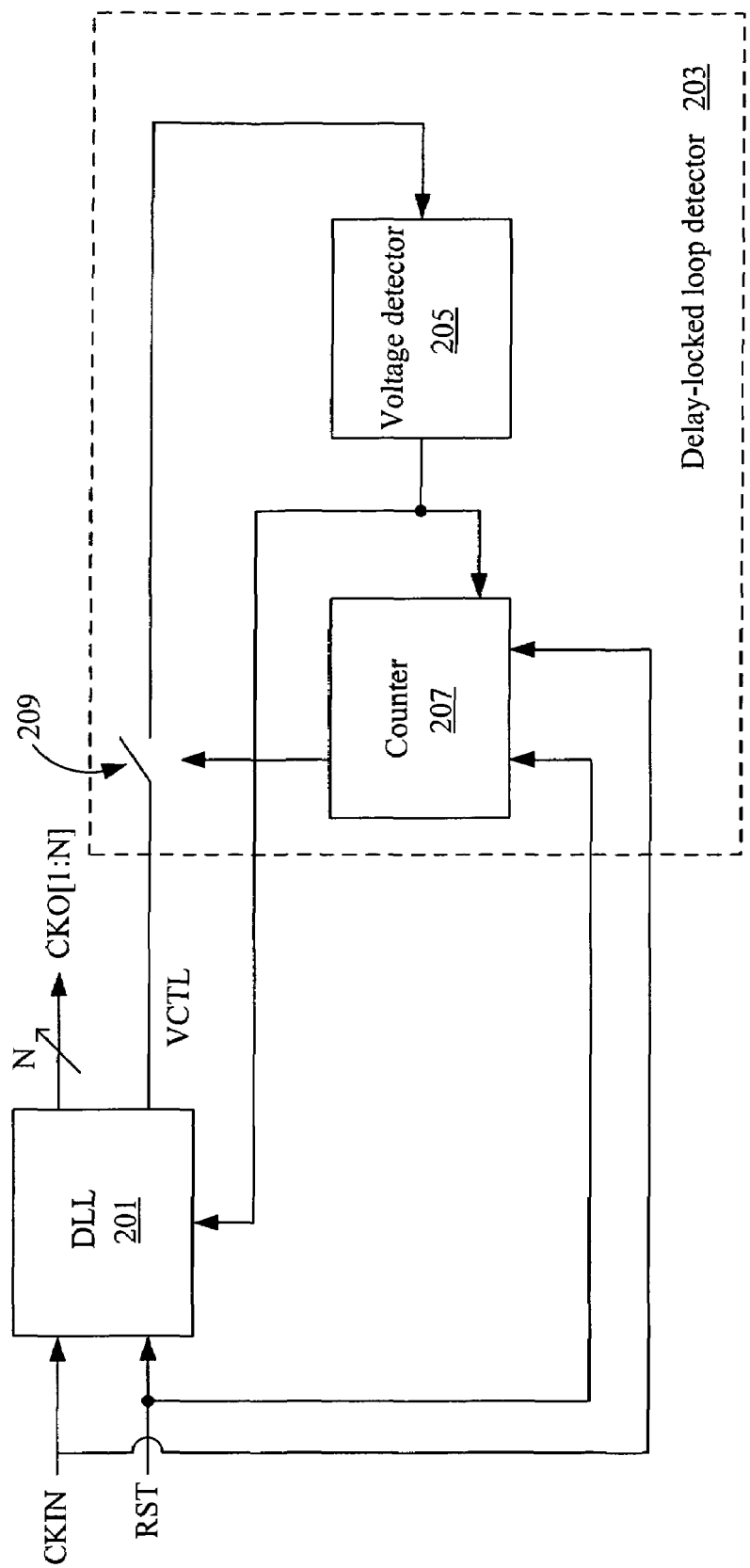
FIG. 2 shows the block diagram of the detector and the DLL thereof according to one embodiment of the present invention.

FIG. 2 shows the block diagram of the delay-locked loop detector and the DLL thereof according to one embodiment of the present invention. The delay-locked loop detector 203 detects the control voltage VCTL used to tune a delay time of a delay-locked loop (DLL) 201, and the output clock signal is controlled according to the delay time. The delay-locked loop detector 203 includes a voltage detector 205, a counter 207, and a switch 209. The switch 209 passes the control voltage VCTL to the voltage detector 205, and the voltage detector 205 detects the control voltage VCTL of the DLL 201 to identify if the voltage level of the control voltage VCTL is out of range. If the control voltage VCTL is out of range, greater than 1.5 V or less than 0.5 V for example, the voltage detector 205 resets the counter for re-counting, and resets the DLL for re-locking as well.

The counter 207 counts a constant period of time, and disconnects the switch 209 from passing the control voltage VCTL to the voltage detector 205 in that period of time.

Because the DLL 201 needs some time, such as 1000 clock cycles, to initialize and generate the output clock signal, and the output control signal is unstable in that period of time, so the counter 207 first disables the switch 209 from passing the control voltage VCTL, and then enables the switch 209 to pass the control voltage VCTL after that period of time.

Figure 3:
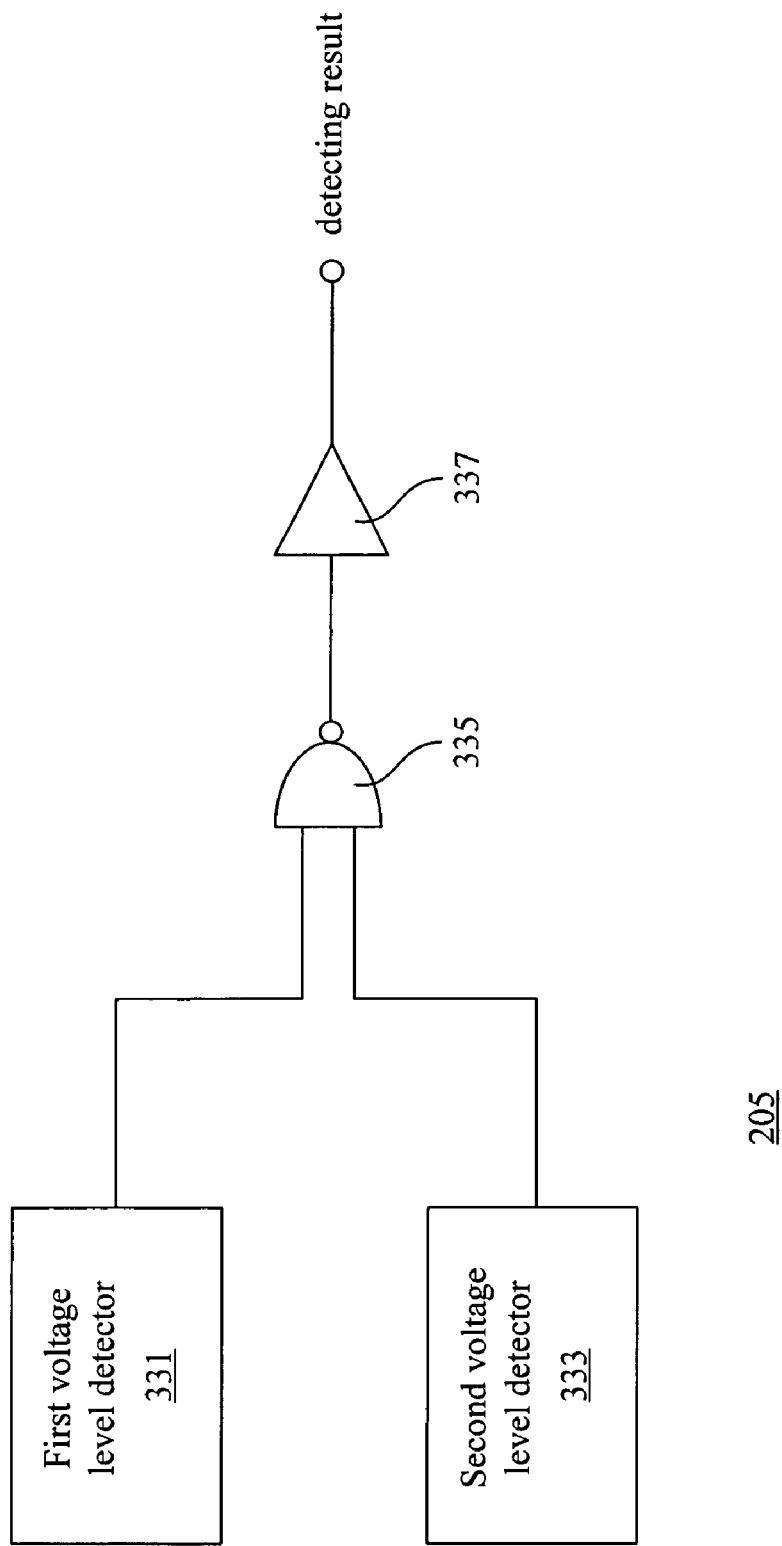
FIG. 3 shows the block diagram of the voltage detector according to one embodiment of this invention.

FIG. 3 shows the block diagram of the voltage detector according to one embodiment of the present invention. The voltage detector 205 includes a first voltage level detector 331 and a second voltage level detector 333 which resets the DLL to relock the output clock and the counter to re-count when the control voltage VCTL is greater than a first voltage level or less than a second voltage level. The outputs of the first voltage level detector 331 and the second voltage level detector 333 are electrically connected to the NAND gate 335 and the first buffer 337 afterward to generate a detecting result which resets the DLL and the counter if the control voltage is out of range.

Figure 4B:
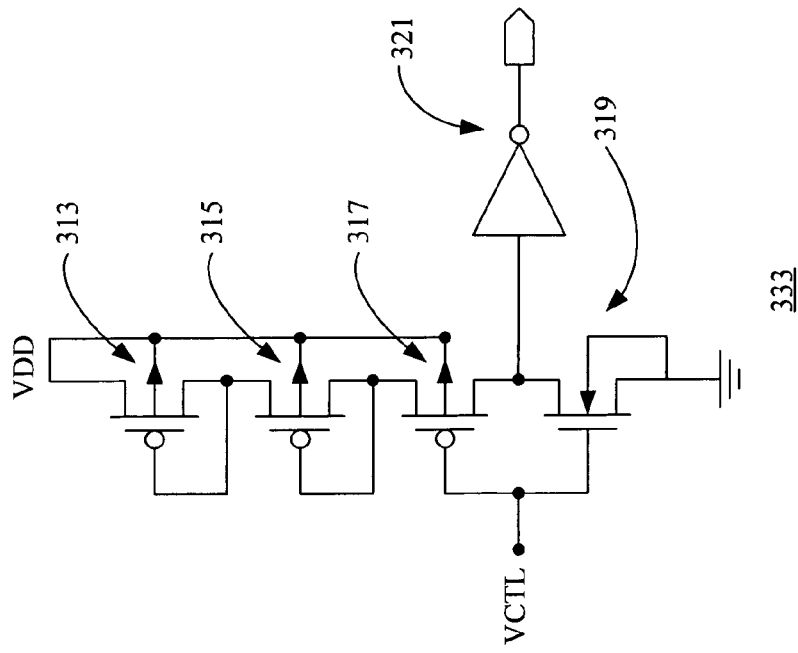
FIG. 4B shows the second voltage level detector according to one embodiment of the present invention.
Figure 4A:
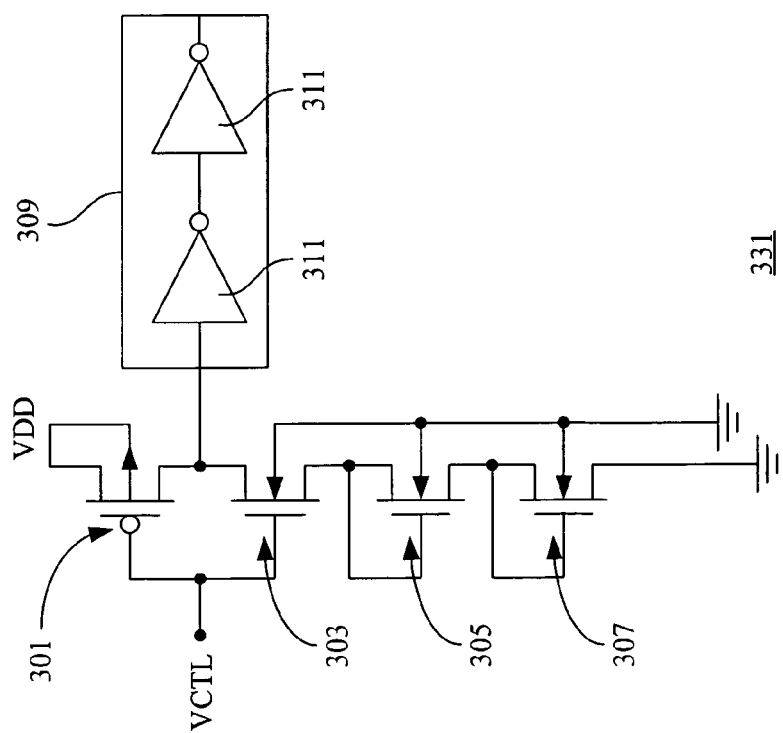
FIG. 4A shows the first voltage level detector according to one embodiment of the present invention.

FIG. 4A shows the first voltage level detector according to one embodiment of the present invention. The first voltage level detector 331 used for identifying if the control voltage VCTL is greater than the first voltage level, such as 1.5 V, includes a first transistor 301, a second transistor 303, a first diode-connected transistor 305, a second diode-connected transistor 307, and a first buffer 309. The first buffer 309 is generally implemented with two inverters 311. The first transistor 301, usually implemented with a PMOS transistor, has a first source/drain electrically connected to the supply voltage VDD, and a gate receiving the control voltage VCTL. The second transistor 303, usually implemented with a NMOS, has a first source/drain electrically connected to the second source/drain of the first transistor 301 and the buffer 309 which is used to increase the driving ability. The second transistor 303 also has a gate receiving the control voltage VCTL.

The first diode-connected transistor 305 has a first source/drain and a gate electrically connected to a second source/drain of the second transistor 303. The second diode-connected transistor 307 has a first source/drain and a gate electrically connected to a second source/drain of the first diode-connected transistor 305. The second diode-connected transistor 307 also has a second source/drain electrically connected to the ground.

When the control voltage VCTL is greater than the first voltage level (usually 1.5 V), the transistor 303\305\307 turns on, and the first buffer 309 outputs logic 0, which resets the DLL and the counter. By changing the threshold voltage of first diode-connected transistor 305 and the second diode-connected transistor 307, the first voltage level can be tuned.

FIG. 4B shows the second voltage level detector according to one embodiment of the present invention. The second voltage level detector 333 resets the DLL to re-lock and counter to re-count when the control voltage is less than the second voltage level. The second voltage level detector 333 includes a third diode-connected transistor 313, a fourth diode-connected transistor 315, a third transistor 317, a fourth transistor 319, and an inverter 321.

The third diode-connected transistor 313 has a first source/drain electrically connected to the supply voltage VDD. The fourth diode-connected transistor 315 has a first source/drain electrically connected to a second source/drain and a gate of the third diode-connected transistor 313. The third transistor 317 has a first source/drain electrically connected to a second source/drain and a gate of the fourth diode-connected transistor 315.

The fourth transistor 319 has a first source/drain electrically connected to a second source/drain of the third transistor 317, and a second source/drain electrically connected to the ground. Both the gates of the third transistor 317 and the fourth transistor 319 receive the control voltage VCTL. The inverter 321 is electrically connected to the source/drain of the third transistor and the fourth transistor.

When the control voltage VCTL is less than the second voltage level (usually 0.5 V), the fourth transistor 319 turns off and the inverter 321 outputs logic 0, which resets the DLL and the counter. By changing the threshold voltage of fourth transistor 319, the second voltage level can be tuned.

Figure 5:
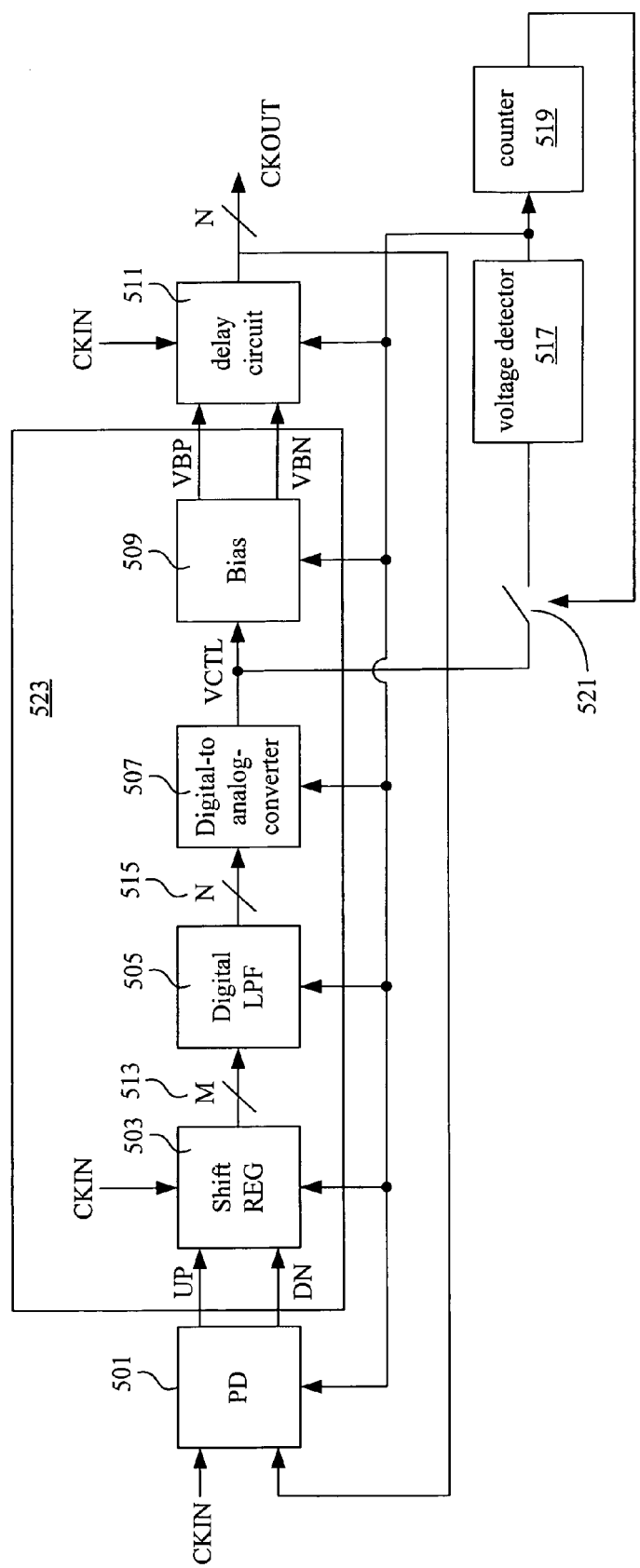
FIG. 5 shows the block diagram of the DLL according to one embodiment of the present invention.

FIG. 5 shows the block diagram of the DLL according to one embodiment of the present invention. The DLL includes a phase detector 501, a converter 523 and a delay circuit 511. The phase detector 501 generates a lagging signal (UP) and a leading signal (DN) corresponding to a phase difference between the input clock signal CKIN and an output clock signal CKOUT. The converter 523 converts the lagging signal and the leading signal into the control voltage VBP/VBN. The delay circuit 511 generates the output clock signal CKOUT according to a delay time tuned through the first control voltage VBP and the second control voltage VBN.

The converter 523 includes a shift register 503, a digital low pass filter 505, a digital-to-analog converter 507, and a bias circuit 509. The shift register 503 outputs a digital data 513 according to the lagging signal and the leading signal, in which only one bit of the digital data 513 is logic one. The digital low pass filter 505 generates a selection signal 515 according to the digital data 513, in which the bit number (M bits) of the digital data 513 is a multiple of the bit number of the selecting signal (N bits) 515.

The digital-to-analog converter 507 converts the selecting signal 515 into a bias voltage VCTL. The bias circuit 509 generates a first control voltage VBP and a second control voltage VBN in response to the bias voltage VCTL. The delay circuit 511 generates the output clock signal CKOUT according to a delay time tuned through the first control voltage VBP and the second control voltage VBN. Because the first control voltage VBP and the second control voltage VBN correspond to the bias voltage VCTL, so the bias voltage VCTL controls the output clock signal CKOUT indeed.

The DLL further includes the voltage detector 517, the switch 521, and the counter 519. The voltage detector 517 detects the bias voltage VCTL. The switch 521 passes the bias voltage VCTL to the voltage detector 517.

The counter 519 counts a constant period of time, and enables the switch 521 to pass the bias voltage VCTL to the voltage detector 517 after the constant period of time. The counter 519 is reset for re-counting the constant period of time and the switch 521 is disabled to pass the bias voltage VCTL when the bias voltage VCTL is greater than the first voltage level.

The voltage detector 517 resets the counter 519 for re-counting and the delay-locked loop for re-locking (generating the output clock signal CKOUT again according to the phase difference between the output clock signal CKOUT and the input clock signal CKIN) when the bias voltage VCTL is greater than a first voltage level which is usually 1.5 V. The voltage detector 517 also resets the counter 519 and the delay-locked loop when the bias voltage VCTL is less than a second voltage level which is usually 0.5 V. Hence, if the bias voltage VCTL is out of range and the DLL is deadlocked at wrong frequency, then the voltage detector 517 can reset the DLL to re-lock the output clock signal CKOUT, which prevent the DLL from deadlocking at wrong frequency.

According to the above embodiment, the DLL and its detecting circuit can reset itself for re-locking if the detected control (bias) voltage is out of range and unable to return back to the normal voltage level. Hence, the deadlock of the DLL can be prevented, and the DLL and the whole chip can operate at scheduled frequency as result.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delay-locked loop detector detecting a control voltage of a delay-locked loop, in which the delay-locked loop generates an output clock signal according to a delay time which is controlled by the control voltage, and the delay-locked loop detector comprises:
   a voltage detector detecting the control voltage;
   a switch passing the control voltage to the voltage detector; and
   a counter counting a constant period of time, wherein the counter enables the switch to pass the control voltage to the voltage detector after the constant period of time.

2. The delay-locked loop detector as claimed in claim 1, wherein the voltage detector comprises a first voltage level detector which resets the delay-locked loop for re-locking when the control voltage is greater than a first voltage level.

3. The delay-locked loop detector as claimed in claim 2, wherein the counter is reset to re-count the constant period of time and the switch is disabled from passing the control voltage when the control voltage is greater than the first voltage level.

4. The delay-locked loop detector as claimed in claim 2, wherein the first voltage level detector comprises:
   a first transistor having a first source/drain electrically connected to a supply voltage, and a gate receiving the control voltage;
   a second transistor having a first source/drain electrically connected to a second source/drain of the first transistor, and a gate receiving the control voltage;
   a first diode-connected transistor, having a first source/drain and a gate electrically connected to a second source/drain of the second transistor; and
   a second diode-connected transistor, having a first source/drain and a gate electrically connected to a second source/drain of the first diode-connected transistor, and a second source/drain electrically connected to a ground voltage.

5. The delay-locked loop detector as claimed in claim 4, wherein the first voltage level detector further comprises a first buffer electrically connected to the second source/drain of the first transistor.

6. The delay-locked loop detector as claimed in claim 2, wherein the voltage detector further comprises a second voltage level detector which resets the delay-locked loop for re-locking when the control voltage is less than a second voltage level.

7. The delay-locked loop detector as claimed in claim 6, wherein the second voltage level detector comprises:
   a third diode-connected transistor having a first source/drain electrically connected to the supply voltage;
   a fourth diode-connected transistor having a first source/drain electrically connected to a second source/drain and a gate of the third diode-connected transistor;
   a third transistor having a first source/drain electrically connected to a second source/drain and a gate of the fourth diode-connected transistor, and a gate receiving the control voltage;
   a fourth transistor, having a first source/drain electrically connected to a second source/drain of the third transistor, a gate receiving the control voltage, and a second source/drain electrically connected to the ground voltage; and
   an inverter electrically connected to the second source/drain of the third transistor and the first source/drain of the fourth transistor.

8. A delay-locked loop, comprising:
   a delay circuit generating an output clock signal according to a delay time which is controlled by a control voltage;
   a voltage detector detecting the control voltage;
   a switch for passing the control voltage to the voltage detector; and
   a counter counting a constant period of time, wherein the counter enables the switch to pass the control voltage to the voltage detector after the constant period of time.

9. The delay-locked loop as claimed in claim 8, wherein the delay-locked loop further comprises:
   a phase detector generating a lagging signal and a leading signal corresponding to a phase difference between a input clock signal and the output clock signal; and
   a converter converting the lagging signal and the leading signal into the control voltage.

10. The delay-locked loop as claimed in claim 8, wherein the voltage detector comprises a first voltage level detector which resets the delay-locked loop for re-locking when the control voltage is greater than a first voltage level.

11. The delay-locked loop as claimed in claim 10, wherein the counter is reset for re-counting the constant period of time and the switch is disabled to pass the control voltage when the control voltage is greater than the first voltage level.

12. The delay-locked loop as claimed in claim 10, wherein the voltage detector further comprises a second voltage level detector which resets the delay-locked loop to re-lock when the control voltage is less than a second voltage level.

13. The delay-locked loop as claimed in claim 12, wherein the counter is reset for re-counting the constant period of time and the switch is disabled to pass the control voltage when the control voltage is less than the second voltage level.

* * * * *